(12) United States Patent
Van Bommel et al.

(10) Patent No.: US 11,774,045 B2
(45) Date of Patent: Oct. 3, 2023

(54) COLOR CONTROLLABLE LED FILAMENT WITH A SMOOTH TRANSITION

(71) Applicant: SIGNIFY HOLDING B.V., Eindhoven (NL)

(72) Inventors: Ties Van Bommel, Horst (NL); Rifat Ata Mustafa Hikmet, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/628,430

(22) PCT Filed: Jul. 16, 2020

(86) PCT No.: PCT/EP2020/070098
§ 371 (c)(1),
(2) Date: Jan. 19, 2022

(87) PCT Pub. No.: WO2021/013675
PCT Pub. Date: Jan. 28, 2021

(65) Prior Publication Data
US 2022/0282840 A1    Sep. 8, 2022

(30) Foreign Application Priority Data

Jul. 22, 2019  (EP) .................................... 19187489

(51) Int. Cl.
*F21K 9/232*    (2016.01)
*F21S 4/20*     (2016.01)
(Continued)

(52) U.S. Cl.
CPC ............... *F21K 9/232* (2016.08); *F21S 4/20* (2016.01); *F21V 19/001* (2013.01);
(Continued)

(58) Field of Classification Search
CPC ............... F21S 4/15; F21S 4/24; F21K 9/232; F21V 9/30
See application file for complete search history.

(56) References Cited

U.S. PATENT DOCUMENTS

2009/0212698 A1* 8/2009 Bailey .................... F21K 9/232
                                                    313/512
2014/0265923 A1    9/2014 Le Toquin
(Continued)

FOREIGN PATENT DOCUMENTS

CN    105972462 A    9/2016
CN    106931317 A    7/2017
(Continued)

OTHER PUBLICATIONS

WO2018157428A1_machine_translation_2018.pdf (Year: 2018).*

*Primary Examiner* — Tracie Y Green (57) ABSTRACT

A LED filament (100) comprising an elongated substrate (110), a first region (120), a second region (130) and a third region (140) arranged between the first and second region. The first region comprises a plurality of LEDs (121) of a first LED type configured to emit light with a first CCT, arranged along at least one row on the substrate. The second region comprises a plurality of LEDs (131) of a second LED type configured to emit light with a second CCT, different from said first CCT, arranged along at least one row on the substrate. The third region (140) comprises at least one first LED (141) of the first LED type and at least one second LED (142) of the second LED type. A first LED of the at least one first LED of the third region is located next to a second LED of the second region. A second LED of the at least one second LED of the third region is located next to a first LED of the first region.

15 Claims, 4 Drawing Sheets

(51) Int. Cl.
*F21V 19/00* (2006.01)
*H01L 25/075* (2006.01)
*F21Y 113/13* (2016.01)
*F21Y 103/10* (2016.01)
*F21Y 115/10* (2016.01)

(52) U.S. Cl.
CPC ...... *H01L 25/0753* (2013.01); *F21Y 2103/10* (2016.08); *F21Y 2113/13* (2016.08); *F21Y 2115/10* (2016.08)

(56) References Cited

U.S. PATENT DOCUMENTS

| | | |
|---|---|---|
| 2015/0009662 A1 | 1/2015 | Shibusawa |
| 2017/0077172 A1 | 3/2017 | Kiba |
| 2018/0249547 A1 | 8/2018 | Wang et al. |
| 2018/0328543 A1 | 11/2018 | Bergmann et al. |
| 2019/0139948 A1* | 5/2019 | Gao .................. F21K 9/64 |
| 2020/0144230 A1* | 5/2020 | Lin .................. H01L 33/62 |

FOREIGN PATENT DOCUMENTS

| | | |
|---|---|---|
| CN | 107202256 A | 9/2017 |
| CN | 108076565 A | 5/2018 |
| CN | 108513391 A | 9/2018 |
| CN | 207911083 U | 9/2018 |
| DE | 202014001943 U1 | 6/2014 |
| DE | 102016116709 A1 | 3/2017 |
| EP | 0348015 A1 | 12/1989 |
| EP | 3099141 A1 | 11/2016 |
| EP | 3480510 A1 | 5/2019 |
| GB | 2498060 A | 7/2013 |
| JP | 2017054749 A | 3/2017 |
| WO | 2018157428 A1 | 9/2018 |

* cited by examiner

COLOR CONTROLLABLE LED FILAMENT WITH A SMOOTH TRANSITION

CROSS-REFERENCE TO PRIOR APPLICATIONS

This application is the U.S. National Phase application under 35 U.S.C. § 371 of International Application No. PCT/EP2020/070098, filed on Jul. 16, 2020, which claims the benefit of European Patent Application No. 19187489.0, filed on Jul. 22, 2019. These applications are hereby incorporated by reference herein.

TECHNICAL FIELD

The present disclosure relates generally to the field of solid state lighting. Specifically, it relates to a light emitting diode (LED) filament comprising LEDs providing light with two different colors, and a lighting device comprising such a LED filament.

BACKGROUND

Incandescent lamps are rapidly being replaced by light emitting diode (LED) based lighting solutions. Solid state lighting devices may provide many advantages over their incandescent, fluorescent, and gas-discharge based counterparts. For instance, they may provide increased operational life, reduced power consumption and higher efficacy. Solid state lighting devices, such as LEDs, are employed in a wide range of lighting applications including general lighting.

LED-based lighting has been developed as retrofit lamps to provide a look and light similar to that of an incandescent bulb. However, further development is required in order to provide improved and more decorative LED-based lighting devices.

WO18157428A1 discloses a LED filament with an adjustable colour temperature. The LED filament comprises a first LED light-emitting array and a second LED light-emitting arraying and by coating the two arrays with different fluorescent colloids with different fluorescent powders mixed therein, and by adjusting the colour temperatures of the first LED light-emitting array and the second LED light-emitting array, the colour temperature of the filament can be adjusted.

SUMMARY

One general aim of the present disclosure is to provide color controllable LED filament lamps. Specifically, there is a desire to be able to control the color temperature of white light LED filament lamps. Adjusting the color temperature of the light may transform the atmosphere of a room. Further, as many people spend a large part of their day indoors, both at home and at work, the effect of different lighting on circadian rhythm and sleeping patterns may become more noticeable. Being able to adjust lighting color temperature during the course of the day may be beneficial both for improved efficiency at work and to maintain healthier sleeping patterns.

It is therefore an object of the present invention to provide improved LED filaments allowing for color control. This and other objects are achieved by means of a LED filament as defined in the appended independent claim. Other embodiments are defined by the dependent claims.

A LED filament is providing LED filament light and comprises a plurality of light emitting diodes (LEDs) arranged in a linear array. Preferably, the LED filament has a length L and a width W, wherein L>5 W. The LED filament may be arranged in a straight configuration or in a non-straight configuration such as for example a curved configuration, a 2D/3D spiral or a helix. Preferably, the LEDs are arranged on an elongated carrier like for instance a substrate, that may be rigid (made from e.g. a polymer, glass, quartz, metal or sapphire) or flexible (e.g. made of a polymer or metal e.g. a film or foil).

In case the carrier comprises a first major surface and an opposite second major surface, the LEDs are arranged on at least one of these surfaces. The carrier may be reflective or light transmissive, such as translucent and preferably transparent.

The LED filament may comprise an encapsulant at least partly covering at least part of the plurality of LEDs. The encapsulant may also at least partly cover at least one of the first major or second major surface. The encapsulant may be a polymer material which may be flexible such as for example a silicone. Further, the LEDs may be arranged for emitting LED light e.g. of different colors or spectrums. The encapsulant may comprise a luminescent material that is configured to at least partly convert LED light into converted light. The luminescent material may be a phosphor such as an inorganic phosphor and/or quantum dots or rods.

The LED filament may comprise multiple sub-filaments.

In the present disclosure, a light emitting diode (LED) filament is provided. The LED filament comprises an elongated substrate, a first region, a second region and a third region. The first region comprises exclusively a plurality of first LEDs of a first LED type, which are configured to emit light with a first correlated color temperature (CCT). The first LEDs of the first region are arranged on the substrate along at least one row. The second region comprises exclusively a plurality of second LEDs of a second type, which are configured to emit light with a second CCT. The second CCT is different from the first CCT. The third region is arranged in between the first region and the second region. The third region comprises at least one first LED of the first type, and at least one second LED of the second type. A first LED of the at least one LED of the first type in the third region is arranged next to a second LED of the second region. A second LED of the at least one second LED of the third region is arranged next to a first LED of the first region.

The plurality of first LEDs of the first region, the plurality of second LEDs of the second region and the at least one first LED and the at least one second LED of the third region may be arranged on a first side of the substrate. The substrate may be at least partially light-transmissive, such as translucent or transparent. In embodiments in which the substrate is at least partially light-transmissive, the LEDs of the first region, the LEDs of the second region and the LEDs of the third region may be arranged on more than one surface (side) of the substrate.

The first LEDs of the first and of the third region may be electrically connected. The second LEDs of the second and of the third region may be electrically connected. Specifically, the connections may be configured to allow separate powering of the plurality of first LEDs and of the plurality of second LEDs.

In other words, the LED filament may comprise a first linear array comprising LEDs of the first type of LEDs which may be interconnected, and a second linear array comprising second LEDs of the second type of LEDs, which may be interconnected. Because the LEDs in the first array are all LEDs of the first type with a first CCT, and the LEDs in the second region are LEDs of the second type with a second CCT, the LEDs of the first and the second array may be arranged so that there is a partial overlap between the first linear array and the second linear array, corresponding to the third region, so that the transition from one color temperature (CCT) to the other color temperature may take place in a gradual manner. The overlap, i.e. the third region, may comprise more than one LED of each type (first and second). For example, the overlap (third region) may comprise two, three or four LEDs of each type.

By way of example, it will be appreciated that, in a linear array, the number of LEDs may be at least 10, more specifically at least 15 and even more specifically at least 17.

Throughout this disclosure, a first LED will refer to a LED of the first type, configured to emit light with the first CCT. A second LED will refer to a LED of the second type, configured to emit light with the second CCT.

In some embodiments, both types of LEDs may emit light having a color rendering index of at least 80, more specifically at least 85, and even more specifically at least 90.

Whiteness of light sources is often described in relation to ideal black body radiators. When the temperature of an ideal black body increases, the body starts glowing red, i.e. emitting red light. As it heats up, the light turns yellow, and finally, for very high temperatures, the emitted light becomes white. The correlated color temperature (CCT) of a light source is the temperature (expressed in kelvin) of an ideal black body radiator showing the most similar color. The black body line, or black body locus (BBL) is the path that such a black body would take in a particular chromaticity space as its temperature increases.

In a sense, the everyday notion of color temperature is opposite to the CCT scale. Usually, a redder light is described to be warm, while a white-blue light is described as cold. In the CCT scale, a red (warm) light corresponds to a lower (colder) temperature, while a white-blue (cold) light corresponds to a higher (warmer) temperature.

According to some embodiments, a first length of the first region and a second length of the second region may be related so that a ratio of the first length to the second length is in a range from 0.9 to 1.1.

A ratio between the lengths of the first and the second regions in the range 0.9-1.1 may give the LED filament a symmetric appearance, which may provide a more homogeneous light distribution at the same time as being aesthetically pleasing.

According to some embodiments, a first length of the first region and a second length of the second region may be related so that a ratio of the first length to the second length is larger than 1.2.

According to some embodiments, a first length of the first region and a second length of the second region may be related so that a ratio of the second length to the first length is larger than 1.2.

For some applications, for example for activities which require higher visibility of objects, it may be desired to have a higher color temperature. In those applications, it may be advantageous to have more LEDs with a higher CCT. Having a longer region with LEDs having a higher CCT may allow for more LEDs with a higher CCT to be arranged on the filament. Accordingly, more light of a higher CCT may be emitted by the LED filament.

Alternatively, it may be desired for the LED filament to provide a cooler (yellower/redder) light, for example in decorative lighting. In such applications, the region with lower CCT LEDs may be longer, in order to comprise more LEDs with a lower CCT.

According to some embodiments, a third length of the third region may be less than half as long as a first length of the first region and/or the third length may be less than half as long as a second length of the second region.

According to some embodiments, the first CCT may be higher than the second CCT.

According to some embodiments, the first CCT may be higher than 2500 K.

Light with a CCT higher than 2500 K may provide a better visibility of objects. Including light above 2500 K may allow for the lighting device to be used for general lighting in places where activities which require high visibility are performed, such as work places. Such activities may for example include reading and cleaning.

For example, the first CCT may be higher than 2700 K. Specifically, the first CCT may be higher than 3000 K, such as 3300 K.

According to some embodiments, the second CCT may be lower than 2400 K.

Light with a CCT lower than 2400 K is classified as warm white. Such light may provide a pleasant atmosphere.

For example, the second CCT may be lower than 2200 K. Specifically the second CCT may be lower than 2100 K, such as 2000 K.

A LED filament with a first type of LEDs providing light with a higher CCT and a second type of LEDs providing light with a lower CCT may allow for color control of the light emitted by the LED filament, based on the powering of the different types of LEDs on the LED filament. Specifically, the light emitted by the LED filament may be a combination of light emitted by the first type of LEDs and the second type of LEDs. The combined light may thus be varied in a range from the CCT of the second type of LEDs to the CCT of the first type of LEDs.

According to some embodiments, the first LEDs of the first region, the second LEDs of the second region, and the first LEDs and the second LEDs of the third region may all be aligned along a single row on the substrate.

Aligning the LEDs of the three regions in one row may provide a slimmer LED filament, which may in turn lower material and/or production costs.

According to some embodiments, the third region may comprise more than one first LED and more than one second LED. The LEDs of the third region may be arranged along a single row in which every other LED is a first LED.

Alternating LEDs of the first type and LEDs of the second type in the third region may provide a transition from LEDs of one CCT to LEDs of the other CCT. Such a transition may provide a more homogeneous illumination and be more aesthetically pleasing.

According to some embodiments, the third region may comprise more than one first LED and more than one second LED. The LEDs of the third region may be arranged to form a gradient transition between the first LEDs of the first region and the second LEDs of the second region.

In other words, the first LEDs and the second LEDs in the third region are not evenly distributed along the third region. To form a gradient (or gradual) transition between the first LEDs of the first region, and the second LEDs of the second region, a density of first LEDs in the third region is higher in a segment next to the first region, and gets gradually lower towards a segment next to the second region, and vice versa for the second LEDs in the third region. For example, a number of successive first LEDs in between each (group of) second LEDs in the third region may be higher in the segment next to the first region, and get gradually lower towards the segment of the third region next to the second region. Similarly, a number of successive second LEDs in between each (group of) first LEDs in the third region may be higher in the segment next to the second region, and get gradually lower towards the segment of the third region next to the first region.

Such an arrangement of the LEDs in the third, overlapping, region may provide a gradual transition from LEDs of one color (CCT) to LEDs of another color (CCT). A gradual transition may provide a gradient in the color (CCT) of the light from the first region (emitting light with the first CCT) to the second region (emitting light with the second CCT). Such a transition may provide the LED filament with a more uniform and aesthetically pleasing illumination.

According to some embodiments, the first LEDs of the first region, the second LEDs of the second region and the first LEDs and the second LEDs of the third region may be arranged along two separate rows on the substrate. The first row may comprise some of the first LEDs from the first region, the first LEDs from the third region and some of the second LEDs from the second region. The second row may comprise some of the first LEDs from the first region, the second LEDs from the third region and some of the second LEDs from the second region.

In other words, the first LEDs of the first region may be arranged in two separate rows and the second LEDs of the second region may be arranged in two separate rows. The at least one first LED of the third region may be arranged in a row which is aligned with one of the rows of first LEDs in the first region, and with one of the rows of second LEDs of the second region, and the at least one second LED of the third region may be arranged in a row aligned with the other row of first LEDs of the first region and the other row of second LEDs of the second region. The rows may be parallel.

Arranging the LEDs of the first, second and third regions in two rows may provide an increasing density of LEDs on the substrate (i.e. providing placement of more LEDs on a shorter substrate). As a consequence, more light may be emitted by a more compact LED filament. Arranging the LEDs of the third region in one row comprising first LEDs and one row comprising second LEDs may provide a transition in the light emitted by the LED filament, from the first CCT to the second CCT.

According to some embodiments, a distance between two successive LEDs in a first portion of the first region, which is located next to the third region, may be shorter than a distance between two successive LEDs in a portion of the first region which is opposite to the first portion. Further, a distance between two successive LEDs in a second portion of the second region, which is located next to the third region, is shorter than a distance between two successive LEDs in a portion of the second region which is opposite to the second portion.

In other words, the distance (or pitch) between successive LEDs may be larger in regions near the end points of the substrate (e.g. in the end portions of a combined row comprising the LEDs of the first, second and third regions), than in areas of the substrate (or the row) which lie in-between such end portions. Increasing the distance between the two outmost LEDs, or the three or four outmost LEDs, in a row of LEDs on a LED filament, may provide a more gradual toning down of the light at the edges of the LED filament.

Further, as the first LEDs in the third region may be placed in an interleaved manner with the second LEDs, or arranged together with the second LEDs in another way, a spacing between two first LEDs (of the first type) in the third region may be larger than a spacing between two first LEDs in the first region. To create symmetry, a spacing between LEDs in the portion of the first region which is furthest from the third region may be adapted to mirror a spacing of first LEDs in the third region, and similarly for the second LEDs. A more symmetric spacing and placement of the LEDs may provide a more homogeneous light, and a more pleasant look of the LED filament and the emitted light may be obtained.

According to some embodiments of the present disclosure, a lighting device is provided. The lighting device may comprise at least one LED filament as described above with reference to any of the preceding embodiments. The lighting device may further comprise an at least partially light-transmissive envelope, which at least partially envelops the at least one LED filament. The lighting device may comprise a base on which the envelope is mounted. The lighting device may comprise a controller configured to control a power supply to the first LEDs of the first region and the at least one first LED of the third region. The controller may further be configured to control a power supply to the second LEDs of the second region and to the at least one second LED of the third region.

For example, the controller may control the power (or current) supply to the first LEDs of the first region and of the third region separately or independently from the power (or current) supply to the second LEDs of the second region and of the third region. Specifically, all the first LEDs of the first and third region may share a power supply, and all the second LEDs of the second and third region may share a separate power supply.

As the plurality of first LEDs and the plurality of second LEDs may be controlled separately, the controller may control the light-emission from the different types of LEDs. Varying the ratio of emission of two sets (or pluralities) of LEDs with different color temperatures, the correlated color temperature (CCT) of the combined light, i.e. the light emitted by the lighting device, may be adapted. Specifically, the range of CCT control may be extend from the CCT of the LED type with the lowest color temperature to the CCT of the LED type with the highest color temperature.

Specifically, varying the ratio of emission between the plurality of first LEDs and the plurality of second LEDs may allow for the color temperature of the combined light (i.e. the light emitted by the lighting device) to move in a range along a line close to the black body line (BBL) between the CCT of the first LED type and the CCT of the second LED type. This means that the LED filament may act similarly to an ideal black body radiator within the range.

In embodiments which include one LED type in a higher color temperature range, and one LED type in a lower color temperature range, the same lighting device may be used for different activities. This may provide a user with the option of adapting the lighting to the present activity and mood depending on the power supplied to the first LEDs as compared to the power supplied to the second LEDs.

Further, control of the power (or current) supply to the first LEDs of the first LED type and to the second LEDs of the second LED type may also control the flux of the light emitted by the lighting device. The controller may be adapted to control both the CCT of the combined light, and the intensity or flux of the combined light.

For example, the at least one LED filament may be arranged to extend away from the base, or to extend substantially parallel to a plane defined by the base.

According to some embodiments, the lighting device may comprise at least one first LED filament as described above in relation to any of the preceding embodiments, and at least one second LED filament as described above in relation to any of the preceding embodiments. The at least one first LED filament and the at least one second LED filament may be arranged substantially parallel with one another in different directions.

Arranging the LED filaments in different directions may increase the uniformity of the light emitted by the lighting device, as the first region of one LED filament may be arranged closer to the second region of another LED filament. Especially, in embodiments in which more than one LED filament is arranged alongside one another every other LED filament may be arranged upside down with regard to the other LED filaments, i.e. with their first regions alongside the second regions of the neighboring LED filaments if the LED filaments are equivalent and symmetrical.

Alternatively, all the LED filaments may be arranged with a similar direction, such as substantially parallel with their first regions arranged along one another and their second regions arranged along one another.

It is noted that other embodiments using all possible combinations of features recited in the above described embodiments may be envisaged. Thus, the present disclosure also relates to all possible combinations of features mentioned herein. Any embodiment described herein may be combinable with other embodiments also described herein, and the present disclosure relates to all combinations of features.

BRIEF DESCRIPTION OF DRAWINGS

Exemplifying embodiments will now be described in more detail, with reference to the following appended drawings.

As illustrated in the figures, the sizes of the elements and regions may be exaggerated for illustrative purposes and, thus, are provided to illustrate the general structures of the embodiments. Thus, embodiments may comprise more or fewer LEDs. Like reference numerals refer to like elements throughout.

DETAILED DESCRIPTION

Exemplifying embodiments will now be described more fully hereinafter with reference to the accompanying drawings, in which currently preferred embodiments are shown. The invention may, however, be embodied in many different forms and should not be construed as limited to the embodiments set forth herein; rather, these embodiments are provided for thoroughness and completeness, and fully convey the scope of the invention to the skilled person.

Figure 1:
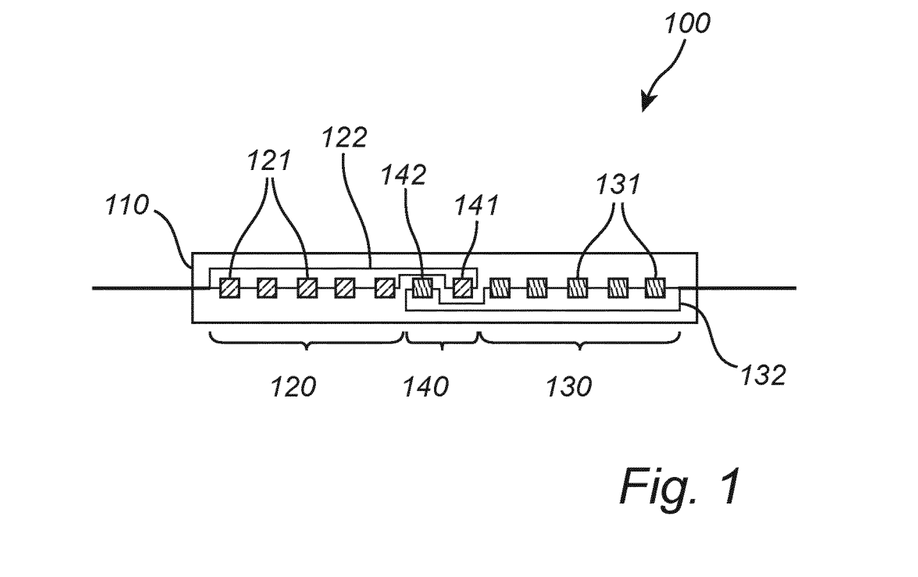
FIG. 1 is a schematic illustration of a LED filament in accordance with some embodiments.

With reference to FIG. 1, a light emitting diode (LED) filament in accordance with some embodiments will be described.

The LED filament 100 of FIG. 1 comprises a substrate 110, a first region 120, a second region 130 and a third region 140. The third region 140 is located between the first region 120 and the second region 130 on the substrate 110. The first region 120 comprises a plurality of first LEDs 121, which are arranged in a row on a first side of the substrate 110. The second region 130 comprises a plurality of second LEDs 131 arranged in a row on the first side of the substrate 110. The third region 140 comprises a first LED 141, and a second LED 142. The third region 140 may correspond to an overlap of two LED arrays, a first LED array comprising the first LEDs 121 of the first region 120 and the first LED 141 of the third region 140, and a second LED array comprising the second LEDs 131 of the second region 130 and the second LED 142 of the third region 140. The first LEDs 121 of the first region 120, the first LED 141 of the third region 140, the second LED 142 of the third region 140 and the second LEDs of the second region 130 are aligned in one row on the substrate 110. The first LED 141 of the third region 140 is arranged next to a second LED of the second region 130. The second LED 142 of the third region 140 is arranged between the first LED 141 of the third region 140 and a first LED of the first region 120.

The first LEDs 121 and the first LED 141 are all of a first type of LED. The LEDs of the first type are configured to emit light with a first correlated color temperature (CCT). The second LEDs 131 and the second LED 142 are all of a second type of LED. LEDs of the second type are configured to emit light with a second CCT which is different from the first CCT. In some embodiments, the first CCT is higher than the second CCT. For example, the first CCT may be higher than 2500 K. Specifically, the first CCT may be higher than 2700 K. More specifically, the first CCT may be higher than 3000 K, such as 3300 K. The second CCT may for example be lower than 2400 K. Specifically, the second CCT may be lower than 2200 K. More specifically, the second CCT may be lower than 2100 K, such as 2000 K.

Light emitted by the first type of LEDs and light emitted by the second type of LEDs arranged on the LED filament 100 together form the light emitted by the LED filament 100.

In some embodiments, the LEDs may be blue and/or UV LEDs which are covered with a luminescent material, e.g. an encapsulant comprising a luminescent material. The luminescent material may be a phosphor such as for example an inorganic phosphor or quantum dots/rods. The blue and/or UV light may then be converted by the luminescent material into converted light. A green/yellow phosphor and/or red phosphor may be used to obtain green/yellow and red light, respectively.

Further, it will be appreciated that the first LEDs and the second LEDs may be phosphor converted LEDs (pc LEDs). The type, concentration and layer thickness of the phosphor of the first LEDs may be different than the type, concentration and layer thickness of the phosphor of the second LEDs. LEDs which emit a lower color temperature typically have a higher thickness of phosphor, a higher concentration and/or a phosphor which emit light at higher wavelengths.

The first LED 141 of the third region 140 is electrically connected to the plurality of first LEDs 121 of the first region 120 via an electrical connection 122. The second LED 142 of the third region 140 is electrically connected to the second LEDs 131 of the second region 130 via an electrical connection 132. The electrical connection 122 may be configured to power the first LEDs 121, 141. The electrical connection 132 may be configured to power the second LEDs 131, 142. In the present embodiment, the first electrical connection 122 and the second electrical connection 132 are serial connections for powering the respective LEDs. In other embodiments, the LEDs may be otherwise connected. For example, the first LEDs may be connected in a parallel connection and/or the second LEDs may be connected in a parallel connection. In other embodiments, the LEDs may be connected in smaller groups.

The substrate 110 may be partially light-transmissive. The substrate may for example be translucent or transparent. The substrate 110 may be at least partially curved. The substrate 110 may be at least partially straight. The substrate 110 may be rigid. The substrate 110 may be flexible.

Figure 2:
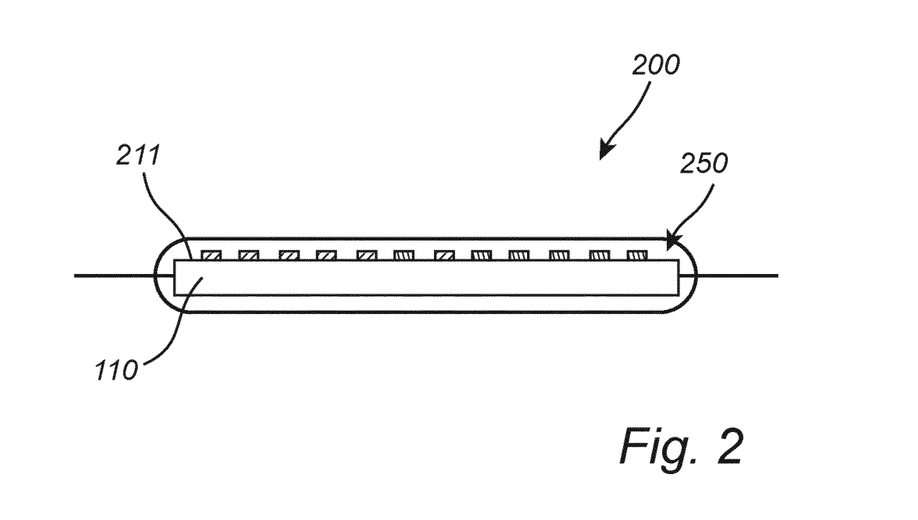
FIG. 2 is a schematic side view of a LED filament in accordance with some embodiments.

With reference to FIG. 2, a LED filament in accordance with some embodiments will be described.

FIG. 2 is a schematic side view of a LED filament 200. The LED filament 200 may be equivalent to the LED filament 100 described with reference to FIG. 1. The LED filament comprises an encapsulant 250 which encapsulates the substrate 110 and the LEDs arranged on the first side 211 of the substrate 110.

In other embodiments, the encapsulant may cover at least part of the LEDs arranged on the first side. The encapsulant may further cover at least part of the substrate. Some embodiments may have LEDs arranged on more than one surface (or side), such as on two opposite surfaces of the substrate. In some embodiments, the encapsulant may cover the sides of the substrate on which LEDs are arranged, and the LEDs on those sides. In some embodiments, the encapsulant may encapsulate all sides of the substrate.

The encapsulant 250 may comprise a polymer. The encapsulant 250 may comprise a silicone-based material. The encapsulant 250 may comprise diffusing material for spreading the light. For example, the encapsulant 250 may include scattering particles, such as one or more of barium sulfate ($BaSO_4$), aluminum oxide ($Al_2O_3$), and titanium dioxide ($TiO_2$) particles. The encapsulant is at least partially light-transmissive, such as translucent or transparent.

Figure 3:
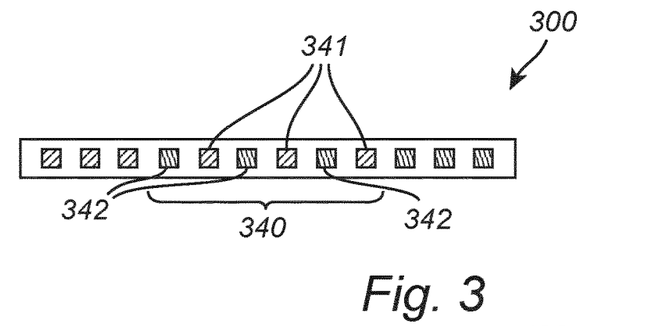
FIG. 3 is a schematic illustration of a LED filament in accordance with some embodiments.

With reference to FIG. 3, a LED filament in accordance with some embodiments will be described. The LED filament 300 may be equivalent to the LED filament 100 described with reference to FIG. 1, except that the third region 340 of the LED filament 300 comprises three first LEDs 341, and three second LEDs 342. The three first LEDs 341 are arranged in an interleaved manner with the three second LEDs 342, such that every other LED in the third region 340 (or overlap) is a first LED 341.

Other embodiments may comprise more or fewer LEDs in the third region, which may be arranged alternatingly as shown in FIG. 3.

Figure 4:
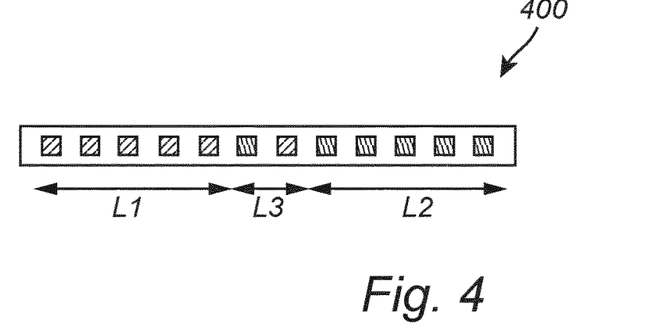
FIG. 4 shows a schematic illustration of a LED filament in which lengths of the different regions are shown.

With reference to FIG. 4, lengths of the different regions will be described. FIG. 4 is a schematic illustration of a LED filament 400 which may be equivalent to the LED filament 100 described with reference to FIG. 1. In FIG. 4, the first region has a first length L1, the second region has a second length L2 and the third region has a third length L3.

In some embodiments, a ratio of the first length L1 to the second length L2 is in the range 0.9-1.1, i.e. $0.9L2<1.1L2$, so that the first region and the second region are about the same length. Such embodiments may have a symmetrical appearance.

In other embodiments, a ratio of the first length L1 to the second length L2 is larger than 1.2, i.e. $L2>1.2L2$. In such embodiments, the first region having first LEDs is longer than the second region comprising second LEDs. Thus, the first region may comprise more LEDs than the second region, providing more intensity at the first CCT.

In other embodiments, a ratio of the second length L2 to the first length L1 is larger than 1.2, i.e. $L2>1.2L1$. In such embodiments, the region having first LEDs is shorter than the second region comprising second LEDs. Thus, the second region may comprise more LEDs than the first region, providing more intensity at the second CCT.

In some embodiments, the third length L3 may be less than half as long as the first length L1, i.e. $L3<0.5L1$. In some embodiments, the third length L3 may be less than half as long as the second length L2, i.e. $L3<0.5L2$.

Figure 5:
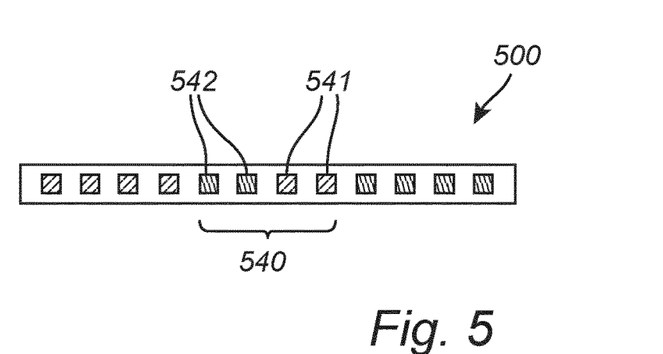
FIG. 5 is a schematic illustration of a LED filament in accordance with some embodiments.

With reference to FIG. 5, a LED filament in accordance with some embodiments will be described.

FIG. 5 is a schematic illustration of a LED filament 500. The LED filament 500 may be equivalent to the LED filament 100, described with reference to FIG. 1, except that the third region 540 comprises two first LEDs 541 and two second LEDs 542. The two first LEDs 541 are arranged next to each other, between one of the second LEDs 542 and a second LED of the second region. Two second LEDs 542 are arranged next to each other, between one of the first LEDs 541 and a first LED of the first region.

In other words, in the third region, the second LEDs form a group of two succeeding a group of two LEDs of the first type. Every two LEDs are of the first type and every two LEDs are of the second type.

In other embodiments, there may be more such alternating pairs of LEDs in the third region. Further, in other embodiments, the LEDs of different kinds may be regrouped by groups of more than two LEDs (such as for example three, four or more).

Figure 6:
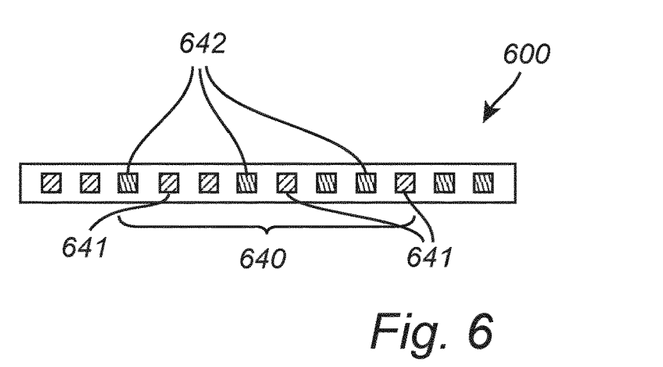
FIG. 6 shows a schematic view of a LED filament in which the LEDs of the third region form a gradient transition, in accordance with some embodiments.

With reference to FIG. 6, a LED filament in accordance with some embodiments will be described.

FIG. 6 is a schematic illustration of a LED filament 600. The LED filament 600 may be equivalent to the LED filament 100 described with reference to FIG. 1, except that there are more LEDs in the third region, which are arranged differently.

The third region 640 of the LED filament 600 comprises four first LEDs 641 and four second LEDs 642. On the LED filament 600 there are, from left to right in the present configuration, a first region, a third region and a second region. The first region is made up by two first LEDs. The third region is formed by a second LED followed by a first LED, two successive second LEDs followed by two successive first LEDs, and a second LED followed by a first LED. The second region comprises two successive second LEDs. The LEDs in the third region 640 form a gradual transition between the first LEDs of the first region to the second LEDs in the second region as the density of first LEDs gradually decreases from the first region towards the second region, and the density of second LEDs gradually increases from the first region towards the second region. Such a gradual transition in the density of the LEDs may provide the light emitted by the third region with a color gradient from the first CCT of the first region to the second CCT of the second region.

Figure 7:
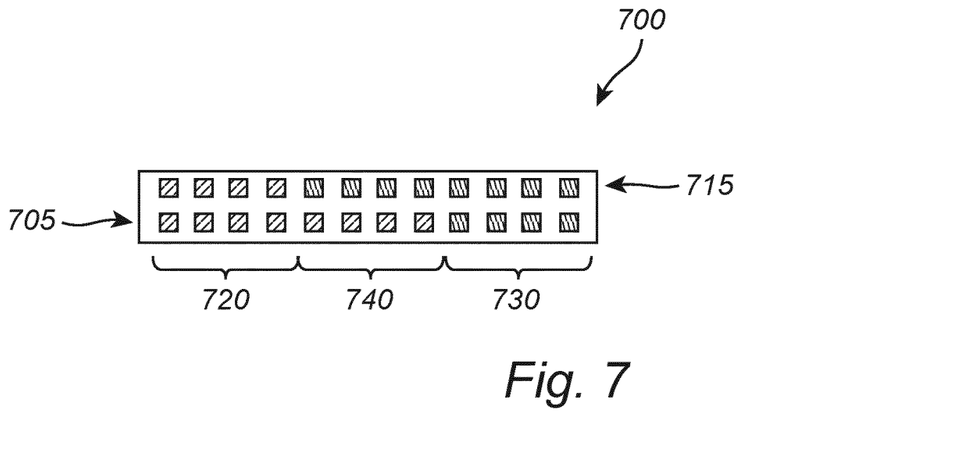
FIG. 7 is a schematic illustration of a LED filament comprising two rows of LEDs, in accordance with some embodiments.

With reference to FIG. 7, a LED filament in accordance with some embodiments will be described.

FIG. 7 is a schematic illustration of a LED filament 700. The LED filament 700 may be equivalent to the LED filament 100, described with reference to FIG. 1, except that the LEDs of the first region 720, the second region 730 and the third region 740 are arranged in two parallel rows 705, 715.

The first row 705 comprises, from left to right in the present illustration, four first LEDs in the first region 720, four first LEDs in the third region 740 and four second LEDs in the second region 730. The second row 715 is, in the present configuration, arranged above the first row 705 on the substrate, and separate from (e.g. parallel with) the first row. The second row 715 comprises, from left to right in the present illustration, four first LEDs in the first region 720, four second LEDs in the third region 740, and four second LEDs in the second region 730. Thus, in the third region 740, the first and second LEDs are arranged in separate rows.

In other embodiments, however, the LEDs may be arranged in more than two rows, and the LEDs of the third region may be arranged in any other way described herein, or using a combination of the arrangements described herein.

Figure 8:
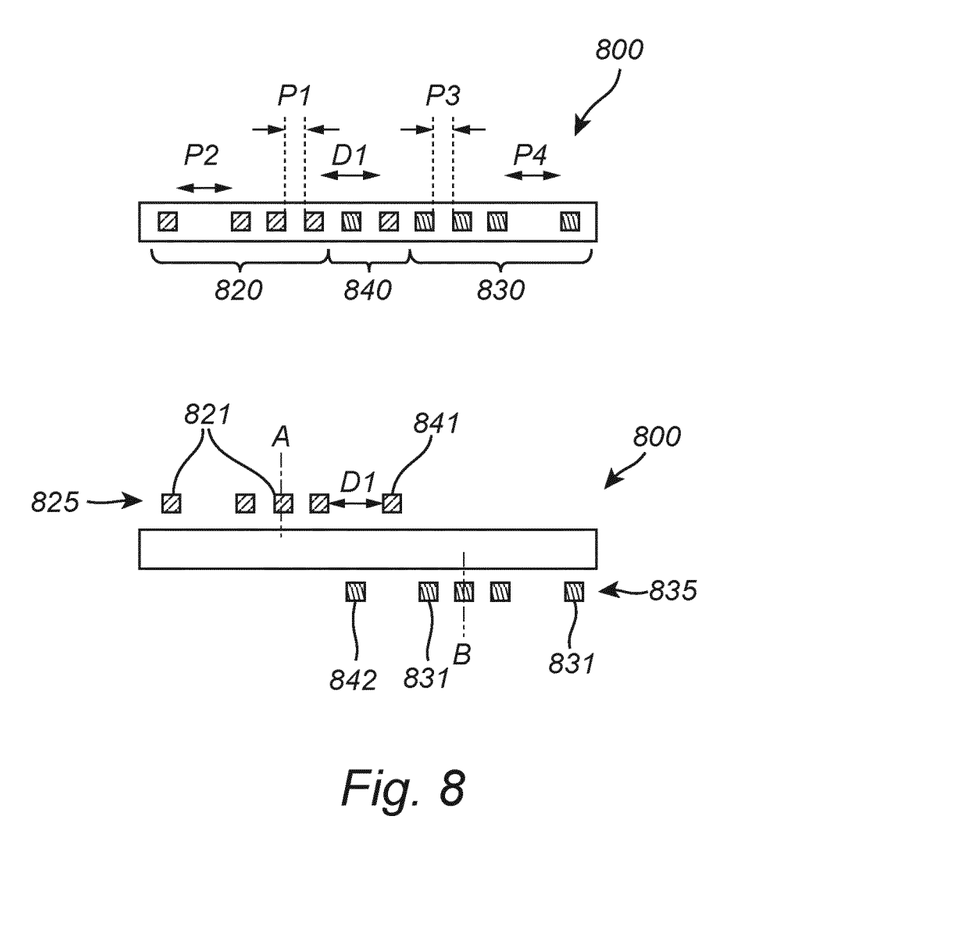
FIG. 8 is a schematic illustration of a LED filament in which the distance between successive LEDs is different in certain portions of the regions, in accordance with some embodiments.

With reference to FIG. 8, a LED filament in accordance with some embodiments will be described.

FIG. 8 shows a schematic image of a LED filament 800 and an exploded view of the LED filament 800. The LED filament 800 may be equivalent to the LED filament 100, except that in some portions the distance between adjacent LEDs varies.

In the present embodiment, the LED filament 800 comprises four first LEDs in the first region 820, one first LED and one second LED in the third region 840, and four second LEDs in the second region 830.

The spacing (or first pitch P2) between the two first LEDs of the first region 820 which are located furthest away from the third region 840 (furthest to the left in the present illustration) is the same as the spacing (or first pitch P4) between the two second LEDs of the second region 830 which are located furthest away from the third region 840 (furthest to the right in the present illustration). Between all other successive LEDs, the spacing (second pitch P1, P3) is the same and shorter than the previously mentioned spacing (first pitch P2, P4).

Turning to the exploded view, it may be seen that a first array 825 comprising the first LEDs 821 of the first region, and the first LED 841 of the second region, is symmetric around the first symmetry line A, which divides the array 825 in two equal parts. The shortest distance D1 between the first LED of the third region 840, and a first LED of the first region 820, is the same length as the first pitch P2, P4.

Similarly, the second array 835 comprising the second LEDs 831 of the second region and the second LED 842 of the third region, is symmetric around the second symmetry line B, which divides the array 835 in two equal parts.

In other embodiments, the spacing between LEDs in the first and second region may be adapted, like in FIG. 8, to mirror the spacing between LEDs of a same type in the third region.

Figure 9:
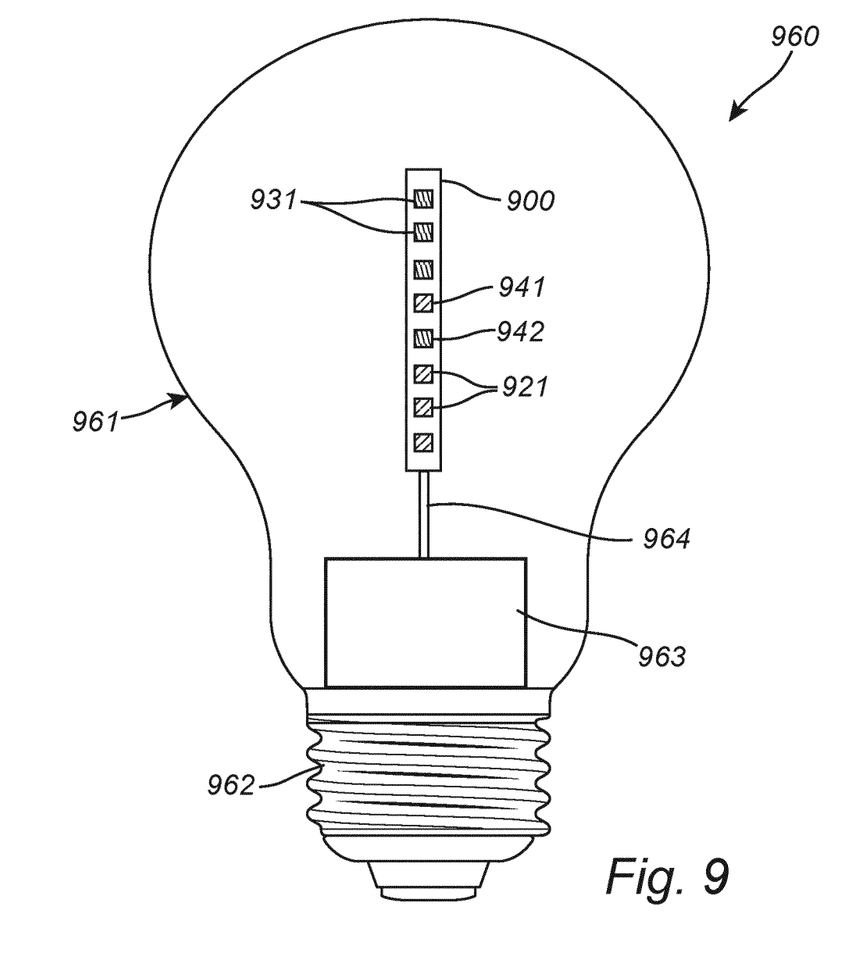
FIG. 9 is a schematic illustration of a lighting device in accordance with some embodiments.

With reference to FIG. 9, a lighting device in accordance with some embodiments will be described.

FIG. 9 is a schematic illustration of a lighting device 960 in accordance with some embodiments. The lighting device 960 comprises a LED filament 900, which may be equivalent to any LED filament described in relation to any of the preceding figures. The lighting device 960 further comprises an at least partially light-transmissive envelope 961, a base 962, a controller 963 and a connector 964.

The LED filament 900 is arranged to extend away from a plane defined by the base 962. In other embodiments, however, the LED filament 900 may be arranged in different orientations.

The envelope 961 envelops the LED filament 900. The envelope 961 is at least partially light-transmissive to couple out the light emitted by the LED filament 900, i.e. to transmit light outside the envelope 961. The envelope 961 has a reflectivity for wavelengths of light emitted by the LED filament 900 which may be less than 20%. Specifically, the reflectivity of the envelope 961 for wavelengths emitted by the LED filament 900 may be less than 15%. More specifically, the reflectivity of the envelope 961 for wavelengths of light emitted by the LED filament 900 may be less than 10%. For example, the envelope 961 may be transparent.

The envelope 961 is mounted on the base 962. The base 962 may comprise electrical connectors for connecting the lighting device 960 to a luminaire socket. The base 962 may be adapted to be connected with for example an Edison socket or a bayonet socket. The base 962 may for example comprise a cap, such as an E27 cap. The base 962 may further comprise a housing. In some embodiments, the controller 963 may be arranged within the housing.

The LED filament 900 is connected to the controller 963 by means of a connector 964. The connector 964 may comprise holding means for holding the LED filament 900. The connector 964 may further comprise electrical connections for supplying power to the LED filament 900.

The controller 963 is configured to control a power supply to the first LEDs 921, 941 of the first type of the LED filament, and a power supply to the second LEDs 931, 942 of the second type of the LED filament 900.

The controller 963 may be configured to control the power supply to the first LEDs 921, 941 and to the second LEDs 931, 942 of the filament 900 individually. Through control of the power supply of the LEDs the brightness of each one of the sets of first LEDs 921, 941 and second LEDs 931, 942 may be controlled.

The ratio of power between the LEDs 921, 941 of the first type and the LEDs 931, 942 of the second type is of particular interest, as a change in the ratio of emittance between the LEDs of the different types may change the color temperature of the combined light. The controller 963 may control the color temperature of the light emitted by the lighting device 960 in a range extending from the CCT of the first LEDs 921, 941 (no power supplied to the second LEDs 931, 942) to the CCT of the second LED 931, 942 (no power supplied to the first LEDs 921, 941).

The controller 963 may be configured to operate the LED filament in different modes. According to a first operation mode, which may be referred to as "start with high CCT", the first LEDs and the second LEDs may be switched off in an initial state and then the first LEDs are switched on while the second LEDs are still switched off. As a next step, the second LEDs may be switched on while the first LEDs are still switched on. An advantage of this procedure or mode of operation may be that high quality light is provided directly when the LED filament, or the lighting device, is turned on (objects are better visible with higher CCT).

According to another operation mode, which may be referred to as "start with low CCT", the first LEDs and the second LEDs may be switched off in an initial state and then the second LEDs are switched on while the first LEDs are still switched off. As a next step, the first LEDs may be switched on while the second LEDs are still switched on. An advantage of this procedure is then to start with filament light.

As yet another operation mode, which be referred to as "start with averaged CCT", the first LEDs and the second LEDs are switch off in an initial state and both the first and the second LEDs are switched on. Such an operation mode provides a gradient look, which may be seen as a design feature.

In accordance with other operation modes, the LEDs may be switched on to immediately reach a maximum current or to gradually reach a certain current level (slowly increasing the current). In analogy, the LEDs may be switched off to be switched off to immediately suppress all current supply or using a dimming function (slowly decreasing the current).

Each LED of the first LEDs may provide a first luminous flux (LF1) while each LED of the second LEDs may provide a second luminous flux (LF2). In case the first and second LEDs are switched on, the LEDs may be controlled to switch from LF1>LF2 to LF2>LF1. In this way, the (correlated) color temperature may be adapted.

Figure 10:
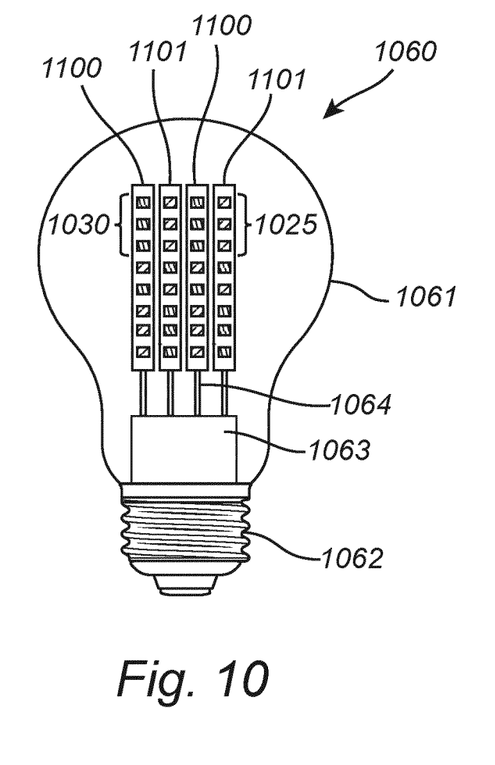
FIG. 10 is a schematic illustration of a lighting device comprising more than one LED filament in accordance with some embodiments.

With reference to FIG. 10, a lighting device in accordance with some embodiments will be described.

FIG. 10 is a schematic illustration of a lighting device 1060, which may be equivalent to the lighting device 960 described with reference to FIG. 9, except that it comprises four LED filaments 1100, 1101 which may be equivalent to any LED filaments described with reference to the preceding figures.

The lighting device 1060 comprises a pear-shaped envelope 1061, mounted on a base 1062. Inside the envelope, two first LED filaments 1100 and two second LED filaments 1101, which may be of the same type as the two first LED filaments 1100, are arranged. The LED filaments 1100, 1101 are arranged parallel to one another, and extending away (substantially perpendicularly) from a plane defined by the base 1062 of the lighting device 1060. The LED filaments 1100, 1101 are connected to a controller 1063 via connections 1064.

The LED filaments 1100, 1101 are arranged so that every other LED filament is a first LED filament 1100, and every other LED filament is a second LED filament 1101. The two first LED filaments 1100 are directed such that the segments of the first LED filaments 1100 comprising the second regions 1030 are the furthest away from the base 1062. The two second LED filaments 1101 are arranged upside down relative to the two first LEDs. In other words, the two second LED filaments 1101 are arranged in the opposite direction with regard to the first LED filaments 1100, so that the segments of the two second LED filaments 1101 comprising the first regions 1025 are arranged furthest away from the base 1062.

In other embodiments, the LED filaments 1100, 1101 may be arranged differently within the envelope 1061. For example, the LED filaments 1100, 1101 may be arranged in the same direction. Alternatively, the LED filaments 1100, 1101 may be arranged in different directions and orientations.

The person skilled in the art realizes that the present invention by no means is limited to the preferred embodiments described above. On the contrary, many modifications and variations are possible within the scope of the appended claims.

Although features and elements are described above in particular combinations, each feature or element can be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite articles "a" and "an" do not exclude a plurality. The mere fact that certain features are recited in mutually different dependent claims does not indicate that a combination of these features cannot be used to advantage.

The invention claimed is:

1. A light-emitting diode, LED, filament comprising:
an elongated substrate;
a first region comprising exclusively a plurality of first LEDs of a first LED type configured to emit light with a first correlated color temperature, CCT, and arranged along at least one row on said substrate;
a second region comprising exclusively a plurality of second LEDs of a second LED type configured to emit light with a second CCT, different from said first CCT, and arranged along at least one row on said substrate; and
a third region arranged between said first region and said second region on said substrate, said third region comprising at least one first LED of said first LED type and at least one second LED of said second LED type, wherein a first LED of said at least one first LED of said third region is located next to a second LED of said second region, and wherein a second LED of said at least one second LED of said third region is located next to a first LED of said first region, such that a transition between the first CCT in the first region and the second CCT in the second region takes place in a gradual manner, over a predetermined period of time.

2. The LED filament of claim 1, wherein a first length of said first region and a second length of said second region are related so that a ratio of said first length to said second length is in a range from 0.9 to 1.1.

3. The LED filament of claim 1, wherein a first length of said first region and a second length of said second region are related so that a ratio of said first length to said second length is larger than 1.2.

4. The LED filament of claim 1, wherein a first length of said first region and a second length of said second region are related so that a ratio of said second length to said first length is larger than 1.2.

5. The LED filament of claim 1, wherein a third length of said third region is less than half as long as a first length of said first region and/or said third length is less than half as long as a second length of said second region.

6. The LED filament of claim 1, wherein the first CCT is higher than the second CCT.

7. The LED filament of claim 1, wherein the first CCT is higher than 2500 K.

8. The LED filament of claim 1, wherein the second CCT is lower than 2400 K.

9. The LED filament of claim 1, wherein said first LEDs of said first region, said second LEDs of said second region and said first LEDs and said second LEDs of said third region are aligned along a single row on said substrate.

10. The LED filament of claim 1, wherein said third region comprises more than one first LED and more than one second LED arranged along a single row, wherein every other LED is a first LED.

11. The LED filament of claim 1, wherein said third region comprises more than one first LED and more than one second LED which are arranged to form a gradient transition between said first LEDs of said first region and said second LEDs of said second region.

12. The LED filament of claim 1, wherein said first LEDs of said first region, said second LEDs of said second region and said first LEDs and said second LEDs of said third region are arranged along two separate rows on said substrate;
   wherein a first row comprises some of said first LEDs of said first region, said first LEDs of said third region, and some of said second LEDs of said second region; and
   wherein a second row comprises some of said first LEDs of said first region, said second LEDs of said third region, and some of said second LEDs of said second region.

13. The LED filament of claim 1, wherein a distance between two successive LEDs in a first portion of said first region located next to said third region is shorter than a distance between two successive LEDs in a portion of said first region opposite to said first portion and/or wherein a distance between two successive LEDs in a second portion of said second region located next to said third region is shorter than a distance between two successive LEDs in a portion of said second region opposite to said second portion.

14. A lighting device comprising:
   at least one LED filament according to claim 1;
   an at least partially light-transmissive envelope at least partially enveloping said at least one LED filament;
   a base on which said envelope is mounted; and
   a controller configured to control a power supply to said first LEDs of the first region and to said at least one first LED of the third region of said at least one LED filament and a power supply to said second LEDs of the second region, and said at least one second LED of the third region of said at least one LED filament.

15. The lighting device of claim 14, further comprising at least one first LED filament according to claim 1 and at least one second LED filament, wherein said at least one first LED filament and said at least one second LED filament are arranged substantially parallel with one another and in different directions.

* * * * *